United States Patent
Bialer et al.

(10) Patent No.: US 10,520,583 B2
(45) Date of Patent: Dec. 31, 2019

(54) CHIRP MODULATION VIA CHIRP SLOPE SWITCHING

(71) Applicant: GM Global Technology Operations LLC, Detroit, MI (US)

(72) Inventors: Oded Bialer, Petah Tivak (IL); Igal Bilik, Rehovot (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 460 days.

(21) Appl. No.: 15/333,547

(22) Filed: Oct. 25, 2016

(65) Prior Publication Data

US 2018/0113192 A1    Apr. 26, 2018

(51) Int. Cl.
*G01S 7/282* (2006.01)

(52) U.S. Cl.
CPC .................... *G01S 7/282* (2013.01)

(58) Field of Classification Search
CPC .......... G01S 7/282; G01S 13/343; G01S 7/35; G01S 13/42; H03L 7/08; H03L 7/00
USPC ........................................................ 342/195
See application file for complete search history.

(56) References Cited

U.S. PATENT DOCUMENTS

| | | | | |
|---|---|---|---|---|
| 3,641,573 | A * | 2/1972 | Albanese | G01S 13/325 342/127 |
| 4,733,237 | A * | 3/1988 | Apostolos | G01S 7/36 342/13 |
| 2005/0141655 | A1* | 6/2005 | Lee | H03J 7/04 375/344 |
| 2015/0219751 | A1* | 8/2015 | Ebling | G01S 7/038 342/175 |
| 2016/0238998 | A1* | 8/2016 | Pavlovic | G04F 10/005 |
| 2016/0377711 | A1* | 12/2016 | Arage | G01S 7/285 342/118 |

* cited by examiner

*Primary Examiner* — Frank J McGue
(74) *Attorney, Agent, or Firm* — Cantor Colburn LLP

(57) ABSTRACT

A system and method generate a signal for transmission by a radar system. A bit modulator outputs a bit of a binary code. A digital frequency controller outputs a range of frequencies. An order of the range of frequencies is based on the bit. A phase-locked loop generates a signal for transmission by the radar system. The signal includes a chirp comprising the range of frequencies in the order output by the digital frequency controller.

10 Claims, 3 Drawing Sheets

CHIRP MODULATION VIA CHIRP SLOPE SWITCHING

FIELD OF THE INVENTION

The subject invention relates to chirp modulation via chirp slope switching.

BACKGROUND

In some radar applications, such as automotive radar applications, for example, fast frequency chirps may be desirable. A chirp refers to a frequency increase (which may be called an up-chirp) or frequency decrease (which may be called a down-chirp) over time in the transmitted signal. For example, a linear chirp, which refers to a linear increase or decrease in frequency over time, may be transmitted by each element of a multi-input multi-output (MIMO) radar system. Each element may transmit a chirp with a different initial and final frequency such that the transmissions from each of the elements are coded. Typically, the chirp signal is generated using a phase shifter. According to a specific example, a digital frequency controller generates the frequencies involved in the chirp signal, and a phase-locked loop (PLL) generates a sweep over the frequencies generated by the digital frequency controller. A bit modulation is applied to a phase shifter which receives the output of the PLL. This phase shifter is what switches the slope of the chirp signal (or maintains the slope) according to the bit modulation. However, the phase shifter represents additional hardware in the system with its corresponding complexity and cost. Accordingly, it is desirable to provide radar system that implements chirp modulation without the need for a phase shifter.

SUMMARY OF THE INVENTION

In one exemplary embodiment of the invention, a radar system includes a bit modulator configured to output a bit of a binary code; a digital frequency controller configured to output a range of frequencies, wherein an order of the range of frequencies is based on the bit; and a phase-locked loop configured to generate a signal for transmission by the radar system, wherein the signal includes a chirp comprising the range of frequencies in the order output by the digital frequency controller.

In another exemplary embodiment, a method of generating a signal for transmission by a radar system includes providing a bit of a binary code; outputting a range of frequencies, wherein an order of the range of frequencies is based on the bit; and generating a chirp of the signal, wherein the chirp comprises the range of frequencies in the order.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
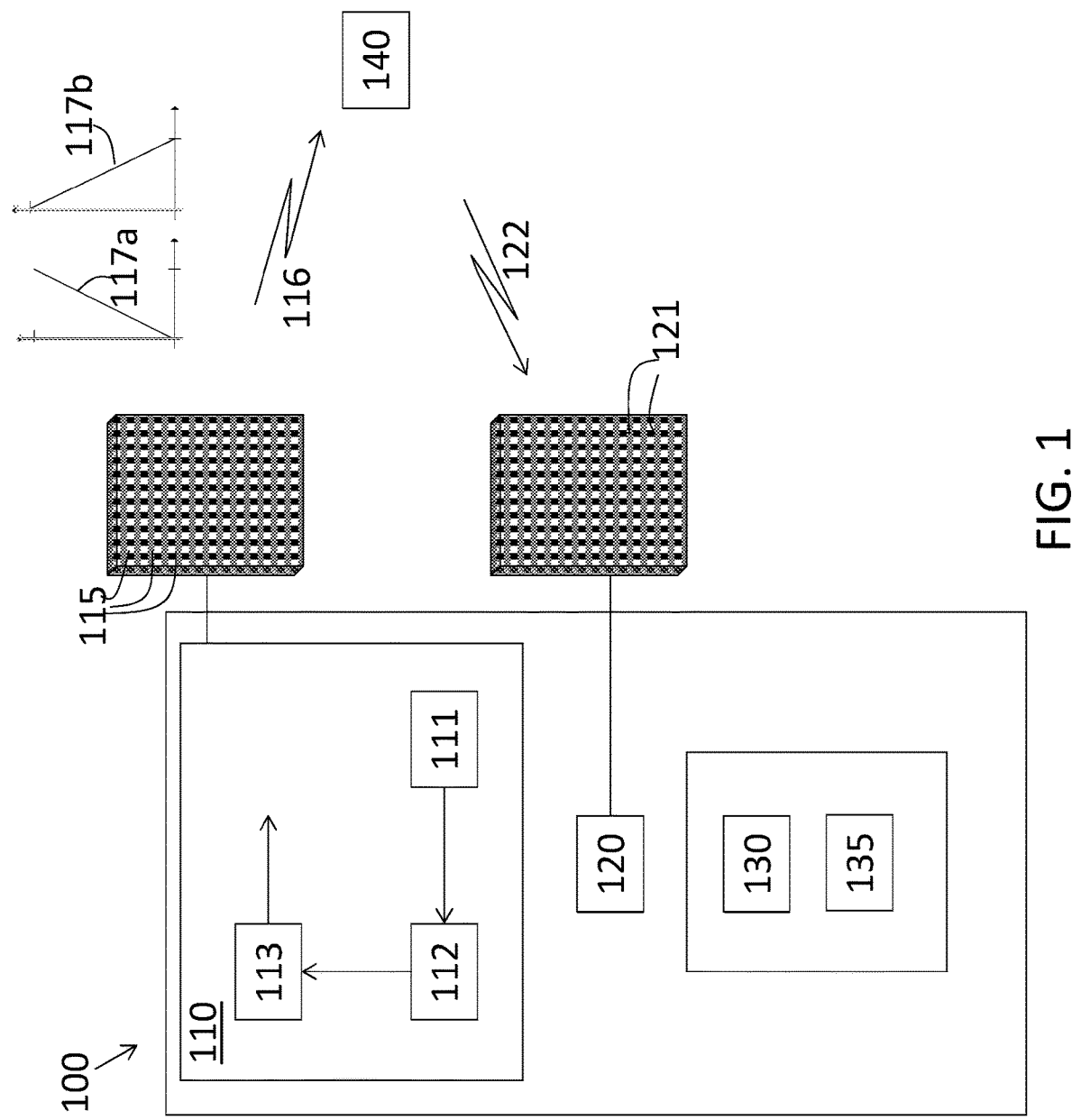
FIG. 1 is a block diagram of a radar system according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a radar system may include phase shifters to generate the chirp signal (increase in frequency or decrease in frequency) that is transmitted. The phase shifters are used to implement a change in slope (increasing frequency or decreasing frequency) of the chirp signal, which reflects the binary code associated with the transmitted signal. However, the phase shifters represent additional cost, additional space, and additional complexity associated with the radar system. When the radar system is part of a platform such as an automobile, the additional costs—especially the space needed for additional components—can present challenges. Embodiments of the systems and methods detailed herein relate to implementing chirp binary coding without the need for the phase shifters. Specifically, the phase-locked loop (PLL) itself outputs the binary coded chirp signal rather than supplying a signal to a phase shifter that receives the bit modulation and imposes that code on the signal.

In accordance with an exemplary embodiment of the invention, FIG. 1 is a block diagram of a radar system 100 according to one or more embodiments. The radar system 100 includes a transmit portion 110, a receive portion 120, and a processing portion that includes one or more processors 130 and one or more memory devices 135. The processor 130 and memory device 135 may aid the transmit portion 110 in generating the transmitted signals 116 or may be completely separate from the transmit portion 110. Two exemplary chirps 117a, 117b that may be part of the transmitted signal 116 are shown in FIG. 1 with time along the horizontal axis and frequency along the vertical axis. The exemplary chirp 117a is an up-chirp signal, and the exemplary chirp 117b is a down-chirp signal.

The exemplary radar system 100 shown in FIG. 1 has a multi-input multi-output (MIMO) configuration. Thus, an array of transmit elements 115 and an array of receive elements 121 are shown in FIG. 1. The number of receive elements 121 may be different than the number of transmit elements 115. Reflections 122 from a target 140, resulting from each transmit signal 116, are received by every receive element 121. Each of the transmit elements 115 may transmit a different code such that the reflections resulting from transmissions by each transmit element 115 can be differentiated. The transmit portion 110 shown in FIG. 1 can supply every transmit element 115. In alternate embodiments, each transmit element 115 is associated with a separate transmit portion 110. The arrangement of the transmit elements 115 and the receive elements 121 in FIG. 1 does not reflect the physical arrangement of the components. The transmit elements 115 and the receive elements 121 may be interleaved in an array, for example.

The transmit portion 110 includes a bit modulator 111, a digital frequency controller 112, and a PLL 113. The bit modulator 111 outputs each specific codeword or bit (−1 or 1) that is part of the code sequence. The bit specifies whether an up-chirp (e.g., associated with bit +1) or a down-chirp (e.g., associated with bit −1) is to be generated. The code sequence associated with each transmit element 115 may be different, as previously noted. As such, the bit modulator 111 receives input from the processing portion (including processor 130 and memory device 135) or a controller (e.g., controller 220 (FIG. 2)) to output the correct sequence of bits for the associated transmit element 115.

The digital frequency controller 112 outputs the range of frequencies of the chirp 117 corresponding with each bit provided by the bit modulator 111. The order in which the frequencies are output is changed based on the bit from the bit modulator 111. For example, an up-chirp ranges from frequency fm to frequency fn (where fm is less than fn) and corresponds with a bit +1, and a down-chirp ranges from frequency fn to frequency fm and corresponds with a bit −1. Then, according to the exemplary embodiment, if the bit modulator 111 outputs a +1, then the digital frequency controller 112 outputs the range of frequencies fm to fn, and if the bit modulator outputs a −1, then the digital frequency controller 112 outputs a range of frequencies fn to fm.

The PLL 113 outputs a chirp 117 with the range of frequencies (fn to fm or fm to fn) specified by the digital frequency controller 112. This chirp 117 is part of the transmitted signal 116 that is transmitted by the associated transmit element 115. The other chirps 117 in the transmitted signal 116 correspond with the other bits in the binary code sequence associated with the transmit element 115.

The bit modulator 111, digital frequency controller 112, and PLL 113 are known components and, thus, the implementations of these components are not further detailed. Arranging the components according to the one or more embodiments described herein has the technical effect of obtaining up-chirp and down-chirp signals without the need for phase shifters.

Figure 2:
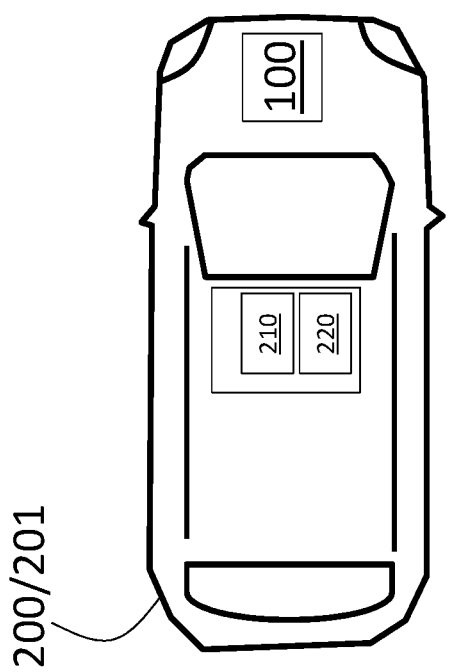
FIG. 2 shows a platform that includes a radar system according to one or more embodiments.

FIG. 2 shows a platform 200 that includes a radar system 100 according to one or more embodiments. The platform 200 is an automobile 201 according to the exemplary embodiment shown in FIG. 2. The platform 200 may alternately be a different type of vehicle or a stationary device. The automobile 201 includes other sensors 210 (e.g., camera, lidar system) and a controller 220 that may receive input from the radar system 100, as well as other sensors 210. The controller 220 may control steering, braking, and other functions of the automobile 201.

Figure 3:
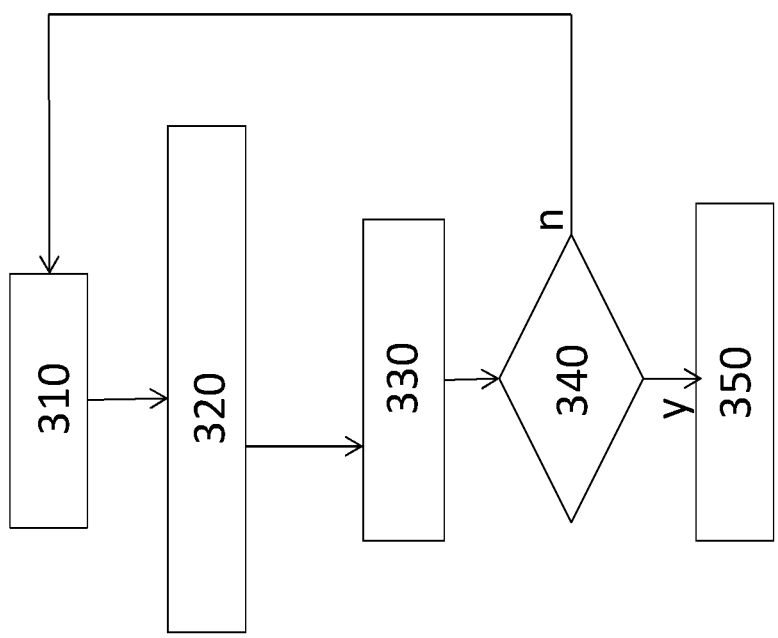
FIG. 3 is a process flow of a method of generating a transmit signal in a radar system according to one or more embodiments.

FIG. 3 is a process flow of a method of generating a transmit signal 116 in a radar system 100 according to one or more embodiments. At block 310, the processes include providing a bit of a binary code to be transmitted. The bit of the binary code is provided by the bit modulator 111, for example. At block 320, outputting a frequency range corresponding with the bit of the binary code refers to outputting the range from frequency fm to frequency fn (when the bit indicates an up-chirp) or a range from frequency fn to frequency fm (when the bit indicates a down-chirp), when fm is less than fn. The digital frequency controller 112 outputs the frequencies, for example. At block 330, generating a chirp 117 with frequencies over the range (output at block 320) refers to generating the up-chirp (117a) or the down-chirp (117b) indicated by the bit. The generating is done by the PLL 113 according to an exemplary embodiment. The up-chirp 117a or down-chirp 117b corresponding with the bit (provided at block 310) is one of a set of chirps that makes up the transmitted signal 116. The other chirps 117 correspond with the other bits of the binary code. These other chirps 117 are obtained based on the check, at block 340, of whether all the bits of the binary code have been provided, as indicated in FIG. 3. The iterations to obtain chirps 117 are repeated until all the bits of the binary code have been provided. Then the chirps 117 are used to generate the transmitted signal 116, at block 350. As previously noted, the processes according to one or more embodiments facilitate omission of phase shifting a generated signal based on the bit, because the bit is taken into account in generating the frequency range (at block 320).

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A radar system, comprising:
   a bit modulator configured to output a bit of a binary code;
   a digital frequency controller configured to output a range of frequencies, wherein an order of the range of frequencies is based on the bit; and
   a phase-locked loop configured to generate a signal for transmission by the radar system, wherein the signal includes a chirp comprising the range of frequencies in the order output by the digital frequency controller.

2. The system according to claim 1, wherein the phase-locked loop is configured to generate the signal as a set of the chirps, and each chirp of the set of chirps corresponds to one of the bits of the binary code.

3. The system according to claim 1, further comprising an array of transmit elements.

4. The system according to claim 3, wherein each transmit element is configured to transmit the signal.

5. The system according to claim 4, wherein the binary code used to generate each signal associated with each transmit element of the array is different.

6. A method of generating a signal for transmission by a radar system, the method comprising:
   providing a bit of a binary code;
   outputting a range of frequencies, wherein an order of the range of frequencies is based on the bit; and
   generating a chirp of the signal, wherein the chirp comprises the range of frequencies in the order.

7. The method according to claim 6, further comprising repeating the providing the bit, the outputting the range of frequencies, and the generating the chirp for each of the bits of the binary code.

8. The method according to claim 6, wherein the providing the bit includes using a bit modulator.

9. The method according to claim 6, wherein the outputting the range of frequencies includes using a digital frequency controller.

10. The method according to claim 6, wherein the generating the chirp includes using a phase-locked loop.

* * * * *